(12) United States Patent  
Tokuhara

(10) Patent No.: US 7,408,344 B2  
(45) Date of Patent: Aug. 5, 2008

(54) MAGNETIC SENSOR

(75) Inventor: Minoru Tokuhara, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/594,843

(22) Filed: Nov. 9, 2006

(65) Prior Publication Data

US 2007/0120555 A1    May 31, 2007

(30) Foreign Application Priority Data

Nov. 28, 2005    (JP)    ............... 2005-342775

(51) Int. Cl.
*G01R 33/02*    (2006.01)
*G01B 7/30*    (2006.01)
(52) U.S. Cl. .............. 324/252; 324/207.21; 324/207.25
(58) Field of Classification Search .......... 324/207.25, 324/173–174, 244, 252, 260, 207.21, 207.24; 73/514.31, 514.39
See application file for complete search history.

(56) References Cited

U.S. PATENT DOCUMENTS

| | | | |
|---|---|---|---|
| 5,637,995 A | 6/1997 | Izawa et al. | |
| 6,614,223 B2 * | 9/2003 | Schroeder et al. | 324/207.22 |
| 7,141,966 B2 * | 11/2006 | Sumiya et al. | 324/207.25 |
| 2006/0001421 A1 | 1/2006 | Sumiya et al. | |

FOREIGN PATENT DOCUMENTS

| | | |
|---|---|---|
| JP | A-07-333236 | 12/1995 |
| JP | A-2001-116815 | 4/2001 |
| JP | A-2004-172334 | 6/2004 |
| JP | A-2006-112801 | 4/2006 |

* cited by examiner

*Primary Examiner*—Bot LeDynh
(74) *Attorney, Agent, or Firm*—Posz Law Group, PLC

(57) ABSTRACT

A magnetic sensor includes a sensing chip having a magnetoresistive element for sensing a magnetic vector and a magnet for biasing the magnetic vector sensed by the magnetoresistive element. The sensing chip senses change in the magnetic vector for detecting a behavior of a magnetic body based on a variation of a resistance value of the magnetoresistive element when biasing of the magnetic vector is caused by the magnet in cooperation with the magnetic body that is in motion in a proximity of the sensing chip, and the magnet takes a shape of a flat cylinder that houses the sensing chip in a hollow space bored therein.

5 Claims, 6 Drawing Sheets

FIG. 6

| DIMENSION | RESTRICTION FACTORS | STUDY RESULT |
|---|---|---|
| t2 | SENSING CHIP THICKNESS TONGUE THICKNESS | 2.5mm |
| w2 | SENSING CHIP WIDTH TONGUE WIDTH | 4.6mm |
| w1 | w2 SATURATION MAGNETIC FIELD MAGNETIC DEFLECTION ANGLE | 18mm |
| t1 | t2 MANUFACTURABILITY SATURATION MAGNETIC FIELD MAGNETIC DEFLECTION ANGLE | 5mm |

MAGNETIC SENSOR

CROSS REFERENCE TO RELATED APPLICATION

This application is based on and claims the benefit of priority of Japanese Patent Application No. 2005-342775 filed on Nov. 28, 2005, the disclosure of which is incorporated herein by reference.

FIELD OF THE INVENTION

The present invention generally relates to a magnetic sensor that uses a magnetoresistive element for detecting a rotation of a magnetic body.

BACKGROUND OF THE INVENTION

Conventionally, a magnetic sensor that utilizes a magneto-resistive element has been widely used for detecting, for example, a rotational movement of an object such as a rotor in an engine or the like. The conventional magnetic sensor usually has a bias magnet for generating a bias magnetic field that biases the magnetic field around the object of interest, and has a sensor chip including the magneto-resistive element disposed between the bias magnet and the object. The conventional magnetic sensor detects the rotational movement of the object of interest as the change in the resistance value of the magneto-resistive element that is caused in part by the rotational movement of the object of interest and in part by the bias magnetic field from the bias magnet.

FIG. 9 shows a plan view of a rotation sensor as an example of the conventional magnetic sensor. The rotation sensor is implemented as a rotation sensing device for detecting a crank angle sensor in an engine of a vehicle (Refer to Japanese Patent Document JP-A-2001-116815 and JP3102268, for example).

As shown in FIG. 9, the magnetic sensor has a sensor chip 101 that includes a magneto-resistive element MRE 1 paired with a magneto-resistive element MRE 2 to make a paired-MRE 1, and also includes a magneto-resistive element MRE 3 with a magneto-resistive element MRE 4 to make a paired-MRE 2. The sensor chip 101 faces a rotor RT that is the object of detection by using the magnetic sensor. The sensor chip 101 is integrated with a processing circuit to make an integrated circuit that is molded with a resin molding 102. More practically, the sensor chip 101 is disposed on one end of a lead frame (not shown in the figure) in the resin molding 102, and the other end of the lead frame is coupled with a power terminal T1, an output terminal T2, a ground terminal T3 and the like that extend out of the resin molding 102. In addition, a bias magnet 130 is disposed in a proximity of the sensor chip 101 for generating the bias magnetic field for the paired-MREs 1 and 2. The bias magnet 130 takes a shape of cylinder with a hollow space 131 bored therein. The hollow space 131 takes a shape of a rectangular hole, and the hole extends in a longitudinal direction in the bias magnet 130. The resin molding 102 housing the sensor chip 101 is inserted in the hole to shape the magnetic sensor.

The magnetic sensor is usually implemented for use, for example, in an engine or the like with a casing that cases the resin molding 102 together with the bias magnet 130. FIG. 10 shows an illustration of an example of the magnetic sensor having a structure described above. Like parts have like numbers in FIGS. 9 and 10.

As shown in FIG. 10, a resin housing 120 integrally shapes a sensor body with the magnetic sensor that houses the resin molding 102 and the bias magnet 130 inserted in a cap member 140 that is in a shape of cylinder with a bottom. The resin housing 120 has, for example, a flange 123 for disposition on an engine, and the flange 123 has an extension that serves as a connector 124 for connecting the magnetic sensor to wiring to external devices such as electronic control units (ECUs) or the like. The terminals T1 to T3 are electrically coupled with metal terminals 100a to 100c that are disposed in the resin housing 120 for serving as the connector 124.

The rotor RT that faces the sensor chip 101 takes, for example, a shape of a gear wheel, and rotation of the rotor RT causes change of a magnetic vector that is composed as a combination of the magnetic field of the rotating rotor RT and the magnetic field of the bias magnet 130. As a result, the change of the magnetic vector is sensed as change of the resistance value of the magneto-resistive element MRE 1 to MRE 4 in the sensor chip 101 in FIG. 9, and is outputted as a rotation detection signal. Then, the rotation detection signal is provided for the external devices such as the ECUs or the like (not shown in the figure) through various kinds of devices such as a differential amplifier, a comarator, and the output terminal T2.

In this manner, the magnetic sensor having the sensor chip 101 inserted in a through hole 131 of the bias magnet 130 that takes a shape of a hollow cylinder has an improved sensitivity beside providing compactness for its shape.

However, the magnetic sensor in the above-described structure has following problems that cannot be ignored when the sensor is implemented, for example, as the crank angle sensor in the engine.

That is, the engine usually has the rotor RT on an end of a crank shaft for the detection of the rotation angle of the rotor RT. Thus, the magnetic sensor itself is generally disposed on an edge portion of a body of the engine where a disposition space at the disposal of the magnetic sensor is relatively abundant. As a result, the accuracy of the rotation detection by the magnetic sensor directly and inevitably suffers from a de-centering about an axis of rotation, a distortion or the like of the crank shaft having the rotor RT disposed thereon due to the deflection of the crank shaft.

The rotor RT of the magnetic sensor is, in recent years, planned to be disposed, for example, at a center portion of the crank shaft where the decentering, the distortion or the like is hard to occur. However, if the disposition of the rotor RT at the hard-to-be distorted portions of the crank shaft is ever possible, the engine does not usually have plenty space for disposing the magnetic sensor at those portions due to a complicated engine structure or the like as the illustration of the example shown in FIG. 10. In other words, the disposition of the magnetic sensor having an exemplary structure shown in FIG. 10 is under severe constraints of space limitation that cannot be ignored.

Further, the space limitation that restricts the disposition of the magnetic sensor for detecting the rotation angle or the like of the moving parts with accuracy is commonly found among machine tools and similar machine having a complicated structure.

SUMMARY OF THE INVENTION

In view of the above-described and other problems, the present invention provides a magnetic sensor that has an improved degree of freedom of placement for use in complicated machinery without compromising detection accuracy.

In one aspect of the present disclosure, the magnetic sensor includes a sensing chip having a magnetoresistive element for sensing a magnetic vector and a magnet for biasing the magnetic vector sensed by the magnetoresistive element. The sensing chip senses change in the magnetic vector for detecting a behavior of a magnetic body (i.e., an object of detection) based on a variation of a resistance value of the magnetoresistive element when biasing of the magnetic vector is caused by the magnet in cooperation with the magnetic body that is in motion in a proximity of the sensing chip, and the magnet takes a shape of a flat cylinder that houses the sensing chip in a hollow space bored therein.

According to the above-described structure, the magnetic sensor itself can be formed in a flat shape, thereby providing an increased degree of freedom of placement for, for example, use in a confined space of machinery.

In another aspect of the present disclosure, the magnet in the magnetic sensor has a greater dimension in a width direction that in a height direction in a view from a magnetic body facing side of the magnet. The width direction of the magnet is defined as the direction that is in parallel with a surface of the sensing chip, and the height direction is defined as the direction that is perpendicular to the surface of the sensing chip. Further, the height dimension of the magnet is preferably between one fourth and one third of the width dimension. In this manner, the magnetic sensor provides an improved degree of freedom of placement.

In yet another aspect of the invention, an outer circumference of the magnet in the magnetic sensor takes a shape of one of an ellipse, a polygon and a combination of the ellipse and the polygon in a view from a magnetic body facing side of the magnet. In this manner, the magnetic sensor provides an improved degree of freedom of placement.

In still yet another aspect of the invention, the magnetic sensor of the present invention has the following characteristics: (1) the sensing chip is disposed on a tongue portion of a case body, and a power terminal and an output terminal of the sensing chip are coupled with a lead frame when the sensing chip is integrally disposed on the tongue portion that is made of non-magnetic material, (2) the magnet is positioned to cover the sensing chip on the tongue portion, (3) a cap member in a cylindrical shape having a bottom covers a tongue supporting portion of the case body for protecting the sensing chip on the tongue portion as well as the magnet that is positioned to cover the sensing chip on the tongue portion. The cap member made of non-magnetic material seals the sensing chip on the tongue portion as well as the magnet by having its opening attached to the tongue supporting portion of the case body. In this manner, the manufacturability of the magnetic sensor is improved besides an increased degree of freedom in terms of structural design or the like due to a reduced size of a sensing portion that faces the magnetic body.

In still yet another aspect of the invention, the magnetic sensor of the present invention has the sensing chip that includes a sensor chip having the magnetoresistive element disposed therein and a processor circuit chip for electrically processing a magnet detection signal from the sensor chip, and the sensor chip and the processor circuit chip are disposed on the tongue portion of the case body as a bare chip. In this manner, the sensor chip and the processor chip is prevented from stress strain caused by resin molding. That is, the output characteristics of the sensor chip and the processor chip are prevented from offset caused by the stress strain. Further, in this case, the flat cylinder shape of the magnetic sensor is still advantageous in terms of freedom of placement. Furthermore, the structure of the sensing chip where the power terminal and the output terminal of the sensing chip coupled with the lead frame in the resin molding, and the cap member of the non-magnetic material attached to the tongue supporting portion for sealing the sensing chip and related parts is still advantageous in terms of freedom of placement. Furthermore, in this case, molding the sensing chip having the sensor chip and the processor circuit chip by resin is still advantageous in terms of an improvement of the manufacturability.

In still yet another aspect of the invention, the case body of the magnetic sensor for holding the sensing chip and the magnet has a flange that extends in a flattening direction of the magnet for installation of the magnetic sensor. In this manner, the magnetic sensor can maintain a flat shape even when the flange is disposed on its outer surface. That is, the flat shape of the magnetic sensor is advantageous in terms of freedom of placement in installation.

The magnetic sensor of the present invention having the above-described structure and other features is advantageous when it is applied for detecting the rotation of the rotor in a proximity of the sensing chip.

BRIEF DESCRIPTION OF THE DRAWINGS

Other objects, features and advantages of the present invention will become more apparent from the following detailed description made with reference to the accompanying drawings, in which:

FIG. 6 shows a dimension table of an outer shape of the magnet;

DETAILED DESCRIPTION OF THE PREFERRED EMBODIMENTS

Embodiments of the present invention are described with reference to the drawings. Like parts have like numbers in each of the embodiments.

In the present embodiment, as described in detail below, the following measures are taken to maintain the detection accuracy for magnetic sensors and yet enhance the degree of freedom with respect to a space required for installation: a magnet having a flat cylindrical shape is adopted as the magnet that applies a bias magnetic field to magnetic resistance elements placed in a sensor chip; and a sensing chip is inserted its the hollow portion of the magnet.

Figure 1:
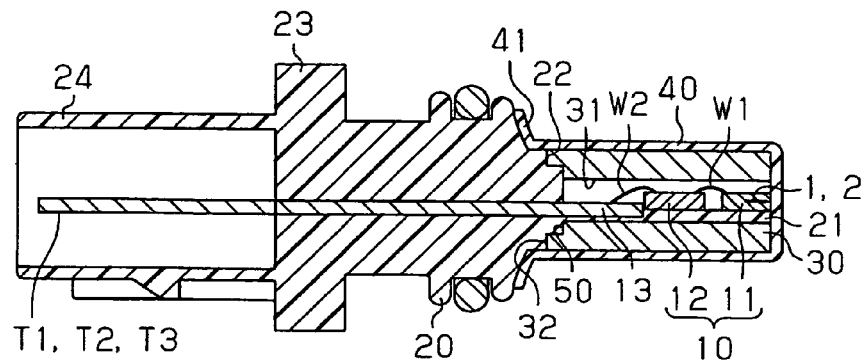
FIG. 1 shows a cross-sectional view of a magnetic sensor in an embodiment of the present invention.
Figure 10:
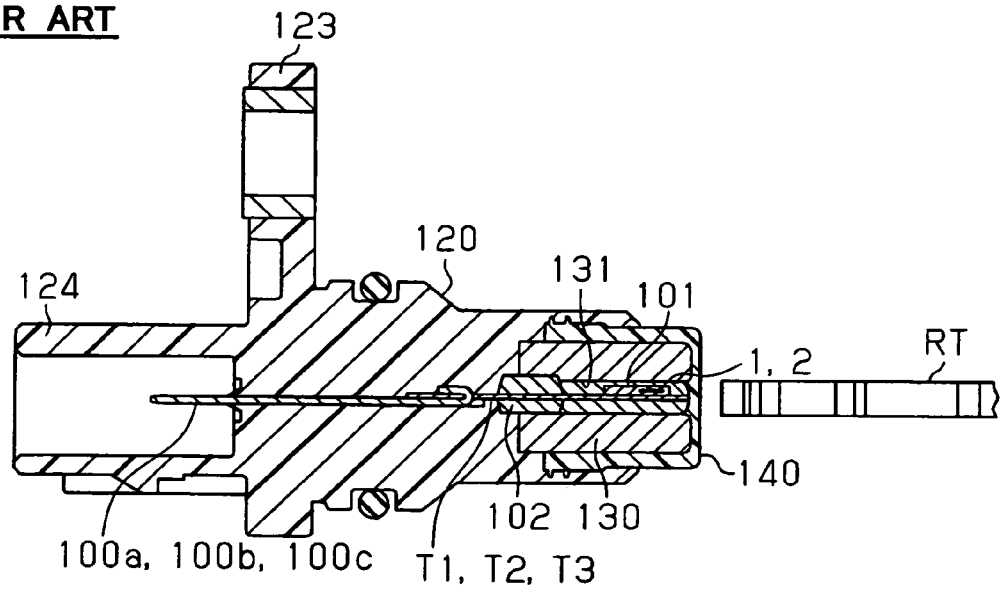
FIG. 10 shows a cross-sectional view of the conventional magnetic sensor.

FIG. 1 illustrates a case where a magnetic sensor in the present embodiment is applied to a rotation detector used for the detection of rotation of, for example, a crank angle sensor for in-vehicle engines, like the sensor illustrated in FIG. 10 as an example. FIG. 1 schematically shows the side sectional view of the magnetic sensor.

As illustrated in FIG. 1, the magnetic sensor in the present embodiment is so structured that the following is implemented: a sensing chip 10 composed of a bare chip and a magnet (bias magnet) 30 are sealed in a housing constructed of a case main body 20 and a cap member 40, and are thereby protected from an external atmosphere.

Of these members, the sensing chip 10 is constructed of a sensor chip 11 having magnetic resistance element pairs 1 and 2 and a processing circuit chip 12 that is constructed as an integrated circuit and carries out various kinds of processing on signals detected by the magnetic resistance element pairs 1 and 2.

The case main body 20 is formed of non-magnetic material, such as PPS (Polyphenylene sulfide) resin or ceramic. It is provided at its side wall with a flange 23 for attaching the magnetic sensor to, for example, an engine, that is not shown in the figure. Further, the case main body 20 is provided at its portion extended from the flange 23 with a connector portion 24 to be connected with an external electronic control unit or the like.

The case main body 20 is provided with a plate-shaped tongue 21 extended in such a manner that it is protruded inward of the cap member 40. In this tongue 21, there are integrally cast the mounting faces of the sensor chip 11 and the processing circuit chip 12 as well as the lead frame 13. On the tongue 21, there are implemented (mounted) the sensor chip 11 and the processing circuit chip 12 so that they are respectively electrically connected with the lead frame 13. More specifically, the sensor chip 11 and the processing circuit chip 12 are electrically connected with each other through a bonding wire W1; and the processing circuit chip 12 and one end of the lead frame 13 are electrically connected with each other through a bonding wire W2. In the present embodiment, the lead frame 13 is formed as a part of plural metal terminals that also function as the terminal of the connector portion 24. These metal terminals respectively form the power feed terminal T1, the output terminal T2, and GND (ground) terminal (the power feed terminal) T3 of the sensing chip 10.

The magnet 30 is formed in the shape of a flat cylinder (flat rectangular cylinder). Its peripheral shape as viewed from the tip side of the magnetic sensor is rectangular, and a similarly rectangular through hole (hollow portion) 31 is formed in its central portion. The magnet is inserted in such a manner that it covers the tongue 21 of the case main body 20, together with the sensing chip 10. This magnet 30 is for applying a bias magnetic field to the magnetic resistance element pairs 1 and 2 incorporated in the sensor chip 11. When the rotor illustrated in FIG. 10 as an example is rotated, change in a magnetic vector caused in cooperation with this bias magnetic field is detected as change in the resistances of the magnetic resistance element pairs 1 and 2. The outer dimensions of the magnet 30 and the setting method therefor will be described in detail later with reference to FIG. 4 to FIG. 6.

The cap member 40 is formed in the shape of closed-end cylinder (closed-end rectangular cylinder) corresponding to the shape of the magnet 30. It is formed of non-magnetic-material, such as resin or ceramic. This cap member 40 protects the tongue 21 and the magnet 30 as well as the sensing chip 10 from an external atmosphere by taking the following measure: the open end 41 of the cap member 40 is joined and integrally assembled together with the case main body 20 in such a manner that the tongue lead-out face (tongue lead-out section) 22 at which the tongue 21 of the case main body 20 is led out is closed with the cap member.

Figure 2:
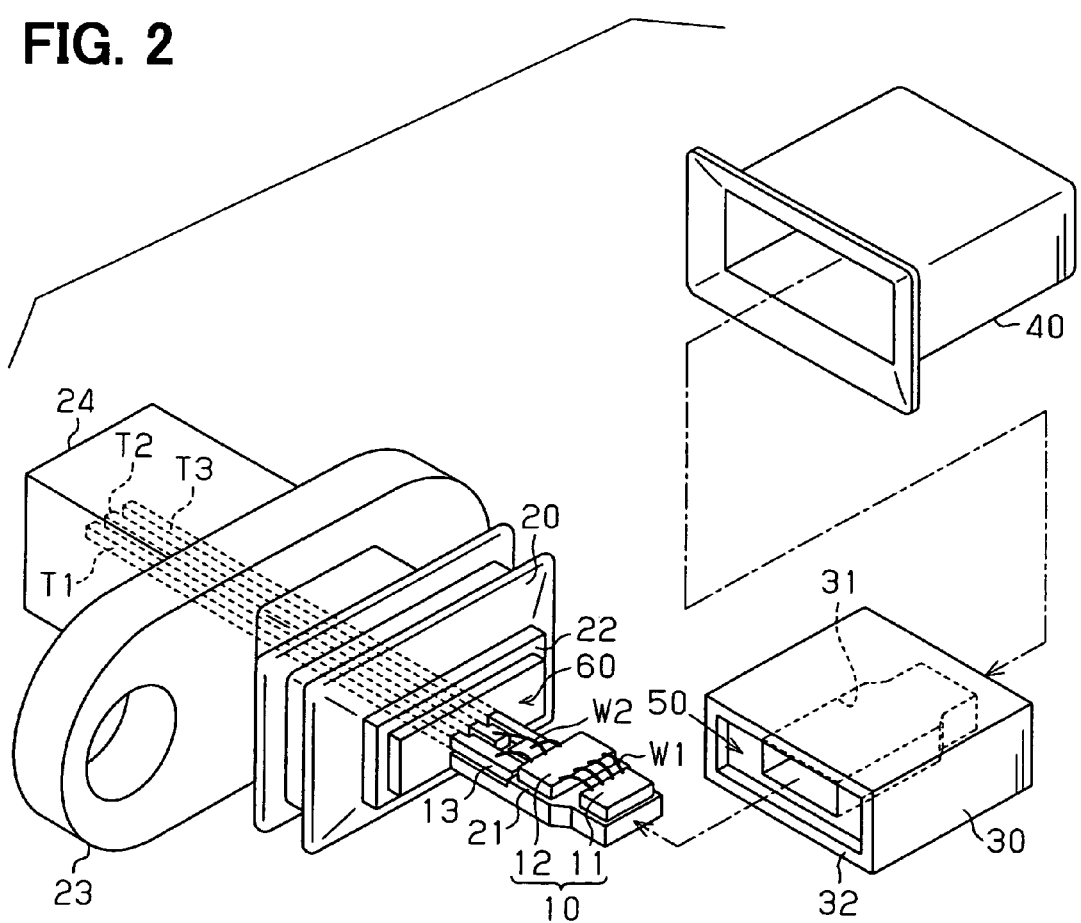
FIG. 2 shows an expanded perspective view of the magnetic sensor in FIG. 1.

FIG. 2 is an exploded perspective view of the parts constructing the magnetic sensor. As illustrated in FIG. 1 and FIG. 2, the following is implemented in the magnetic sensor in the present embodiment: in an end face 32 of the magnet 30, there is formed a recessed portion 50 in a shape substantially analogous to the peripheral shape of the magnet 30; in the tongue lead-out face 22 of the case main body 20 joined with the end face 32, there is formed a projected portion 60 in correspondence with the recessed portion 50. The recessed portion 50 and the projected portion 60 are fit together as fitting portions, and the displacement of the magnet 30 from the tongue lead-out face 22 is thereby arrested.

The sensing chip 10, especially the sensor chip 11, mounted over the tongue 21 of the case main body 20 is positioned with accuracy when it is mounted. For this reason, when the magnet 30 and the case main body 20 are joined together by a fitting mechanism constructed of the recessed portion 50 and the projected portion 60, the biasing of the magnet 30 to the sensor chip 11 is also arrested. As a result, the relative positions of the magnet 30 and the magnetic resistance element pairs 1 and 2 in the sensor chip 11 relative to each other are also set with accuracy.

Figure 3:
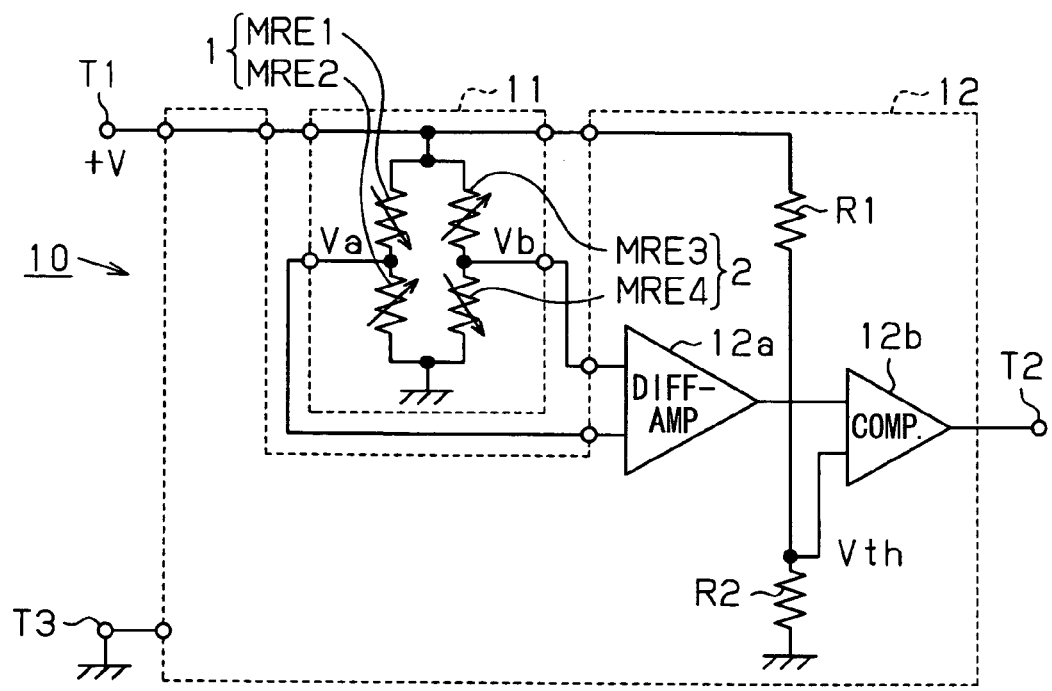
FIG. 3 shows a block diagram of an equivalent circuit of the magnetic sensor.

FIG. 3 illustrates an example of an equivalent circuit in the sensing chip 10. The following description explains the electrical configuration of its magnetic sensor, especially, the configuration of a signal processing circuit with reference to FIG. 3.

As illustrated in FIG. 3 and as mentioned above, the sensing chip 10 is so constructed that it includes the sensor chip 11 and the processing circuit chip 12 as its processing circuit. Of these members, the sensor chip 11 includes the magnetic resistance element pairs 1 and 2 as mentioned above. From the electrical viewpoint, the magnetic resistance element pairs 1 and 2 are respectively constructed as a half bridge in which the magnetic resistance elements MRE1 and MRE2 or the magnetic resistance elements MRE3 and MRE4 are connected in series. A constant voltage "+V" is applied to the common joint between the magnetic resistance elements MRE1 and MRE3, and the common joint between the magnetic resistance elements MRE2 and MRE4 is grounded.

The middle point potential Va in the magnetic resistance element pair 1 in bridge connection and the middle point potential Vb in the magnetic resistance element pair 2 in bridge connection are inputted to the differential amplifier 12a in the processing circuit chip 12. The differential amplification output between the middle point potential Va and the middle point potential Vb, or the output of the differential amplifier 12a is in turn binarized through a comparator 12b. The binary signal (pulse signal) obtained as the result of binarization is outputted as a rotation detection signal of the magnetic sensor through the output terminal T2. In the comparator 12b, the differential amplification output is binarized with reference to a threshold voltage Vth that is obtained by dividing the constant voltage "+V" with resistors R1 and R2.

Figure 4:
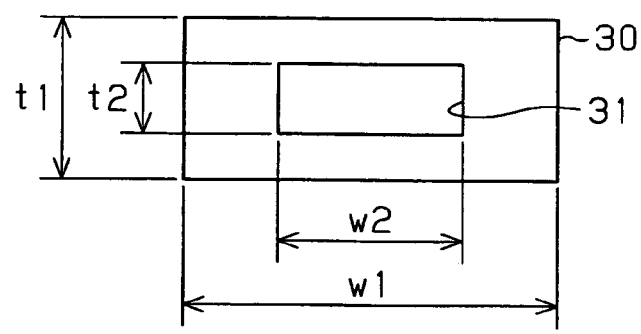
FIG. 4 shows an illustration of a magnet in a view from a rotor facing side.
Figure 9:
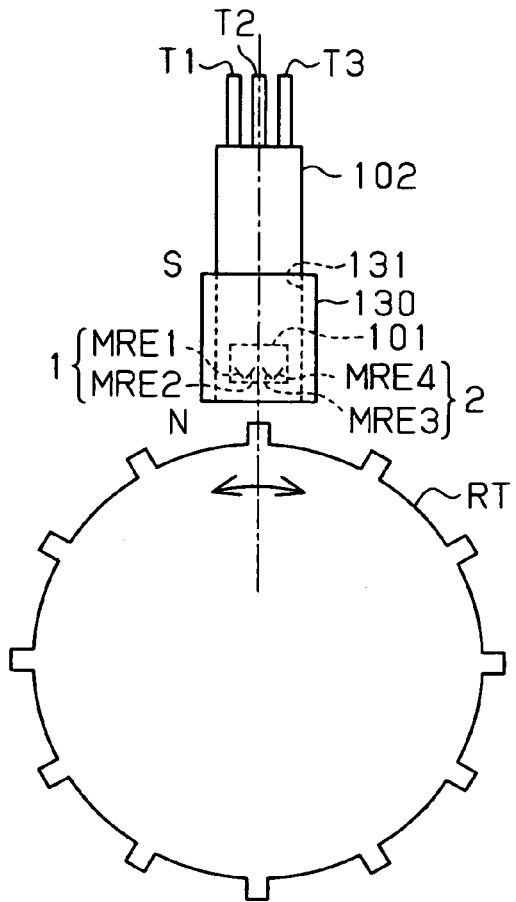
FIG. 9 shows a plan view of a conventional magnetic sensor in combination with a rotor.

FIG. 4 schematically illustrates the peripheral shape of the magnet 30 adopted in the present embodiment and the shape of the through hole 31. The drawing shows these shapes as viewed from the end side (the end side of the magnetic sensor) opposed to the rotor RT (FIG. 9). Description will be given to an example of the setting of the dimensions of the magnet 30 and its through hole 31 with reference to FIG. 4.

As illustrated in FIG. 4 and as mentioned above, this magnet 30 is so formed that its peripheral shape as viewed from the end side of the magnetic sensor is, for example, rectangular. In its central portion, there is formed the similarly rectangular through hole (hollow portion) 31 in the shape of a flat cylinder. The sensing chip 10 (FIG. 2) is housed in this through hole 31. This magnet 30 is so set that its width (thickness) t1 in the direction perpendicular to the surface of the sensing chip 10 housed in the magnet is approximately ¼ of its width w1 in the direction along the surface of the sensing chip 10. The through hole 31 is so set that its length t2 in the direction (vertical direction) perpendicular to the surface of the sensing chip 10 is approximately ½ of its length w2 in the direction (horizontal direction) parallel to the surface of the sensing chip 10.

Figure 5A:
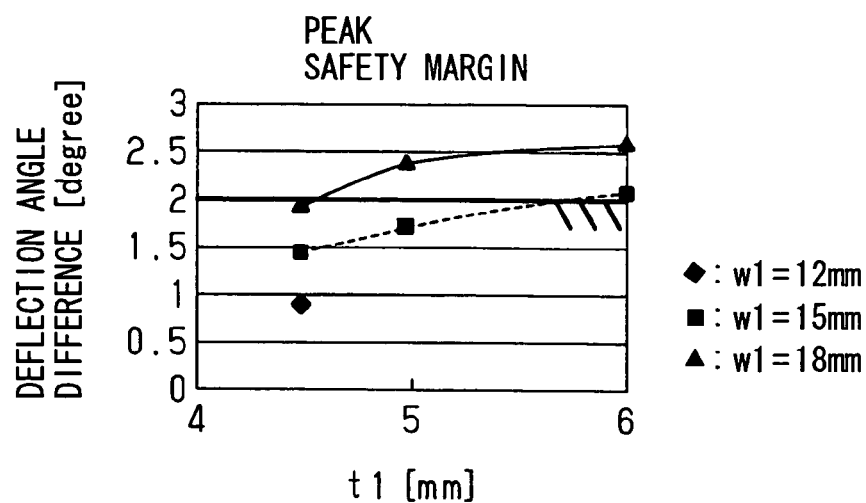
FIGS. 5A and 5B show diagrams of relationship between the thickness of the magnet and a deflection angle difference.
Figure 5B:
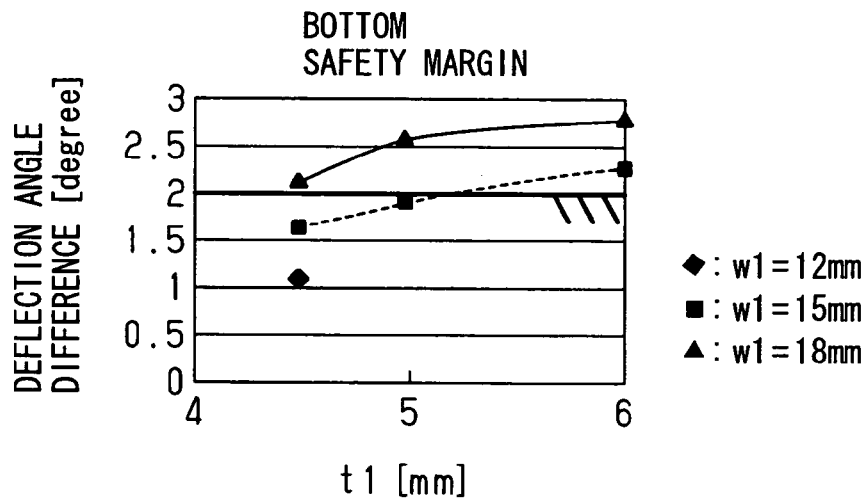

The width w1 and the thickness t1 of the magnet 30 are determined based on such graphs as illustrated in FIGS. 5A and 5B, that are obtained through, for example, experiment, simulation, or the like. FIG. 5A indicates the relation between the thickness t1 of the magnet 30 and a deflection angle difference (to be precise, the magnitude of voltage corresponding to deflection angle difference) for various widths w1 of the magnet 30 with respect to a peak safety margin. The peak safety margin is a safety margin on the side on which the output of the above-mentioned differential amplifier 12a (FIG. 3) exceeds the threshold voltage Vth of the comparator 12b (FIG. 3). FIG. 5B indicates the relation between the thickness t1 of the magnet 30 and a deflection angle difference, for various widths w1 of the magnet 30, with respect to a bottom safety margin. The bottom safety margin is the safety margin on the side on which the output of the differential amplifier 12a does not reach the threshold voltage Vth of the comparator 12b. Detailed description will be given to a method for setting the width w1 and the thickness t1 of the magnet 30 with reference to FIGS. 5A and 5B.

In general, the length t2 of the through hole 31 in the vertical direction depends on the thickness of the sensing chip 10 housed in the through hole 31 and the thickness of the tongue 21 (FIG. 1, FIG. 2); the length w2 of the through hole 31 in the horizontal direction similarly depends on the width of the sensing chip 10 housed in the through hole 31 and the width of the tongue 21 (FIG. 2). The width w1 of the magnet 30 depends on the length w2 of the through hole 31 in the horizontal direction, a required magnitude of a saturation magnetic field, and a required magnitude of a magnetic deflection angle; the thickness t1 of the magnet 30 depends on the length t1 of the through hole 31 in the vertical direction, the required magnitude of the saturation magnetic field, the required magnitude of the magnetic deflection angle, and the manufacturability of such a magnet.

An amount of change in differential amplification output, which is the output of the differential amplifier 12a (FIG. 3), increases with increase in the magnetic field intensity applied to the above-mentioned magnetic resistance elements MRE1 to MRE4 (FIG. 3). However, when the magnetic field intensity exceeds a predetermined magnitude, the amount of change in differential amplification output becomes substantially constant, and the magnetic field is saturated. Therefore, to maintain the favorable detection accuracy of the magnetic sensor, it is preferable for practical use that the magnetic field intensity should be increased to such a level that the amount of change in differential amplification output can be saturated. Therefore, the width w1 and the thickness t1 of the magnet 30 are so set that a magnetic field intensity sufficient to saturate an amount of change in differential amplification output is maintained.

Meanwhile, the differential amplification output as the output of the differential amplifier 12a is binarized through the comparator 12b (FIG. 3) with reference to the threshold voltage Vth, as mentioned above. When the differential amplification output is slightly higher than the threshold voltage Vth or the differential amplification output is slightly lower than the threshold voltage Vth in this case, there is the following possibility: binarization is not properly carried out because of, for example, fluctuation in the constant voltage "+V" or the superposition of noise. To properly carry out binarization, therefore, it is preferable to take the following measure: the peak safety margin, which is the safety margin on the side on which the differential amplification output exceeds the threshold voltage and the bottom safety margin, which is the safety margin on the side on which the differential amplification output does not reach the threshold voltage, should be sufficiently provided. Consequently, both the width w1 and the thickness t1 of the magnet 30 are set in such a manner that a magnetic field intensity sufficient to provide sufficient peak safety margin and bottom safety margin is ensured.

With consideration given to factors that govern the width w1 and thickness t1 of the magnet 30, the graphs shown in FIGS. 5A and 5B are obtained through experiment, simulation, or the like. For example, anisotropic ferrite plastic magnet is adopted for the material for forming the magnet 30. An example of specifications for the material is as follows: residual magnetic flux density is 300 mT; coercive force is 170 kA/m; and maximum energy product is 16 KJ/m$^3$. In FIGS. 5A and 5B, the following items are respectively indicated as follows: the relation between the thickness t1 [mm] of the magnet and the deflection angle difference [degree] when the magnet 30 is so formed that its width w1 is 12 mm is indicated by solid diamond; the relation between the thickness t1 [mm] of the magnet and the deflection angle difference [degree] when the magnet 30 is so formed that its width w1 is 15 mm is indicated by solid square; and the thickness [mm] of the magnet 30 and the deflection angle difference [degree] when the magnet 30 is so formed that its width w1 is 18 mm is indicated by solid triangle.

As is apparent from FIGS. 5A and 5B, the deflection angle difference [degree] increases as the thickness t1 of the magnet 30 increases from 4.5 mm to 5.0 mm to 6.0 mm, regardless of the width w1 of the magnet 30. In the present embodiment, consequently, the outer dimensions of the magnet 30 are set to the smallest one of thicknesses with which both the peak safety margin and the bottom safety margin exceed, for example, 2 degrees and to the smallest width.

Specifically, the outer dimensions of the magnet 30 are so set that its thickness t1 is 5 mm and its width w1 is 18 mm, as indicated by the outer dimension list in FIG. 6. The dimensions of the through hole 31 are so set that its length t2 in the vertical direction is 2.5 mm and its length w2 in the horizontal direction is 4.6 mm. The present inventors confirmed that setting the dimensions of the magnet 30 as mentioned above obtains the detection sensitivity at the same level as of conventional magnetic sensors adopting a hollow circular cylindrical magnet.

As described up to this point, a magnetic sensor according to the present embodiment brings the effects listed below:

(1) As the magnet 30 that applies the bias magnetic field to the magnetic resistance element pairs 1 and 2 provided in the sensing chip 10, the following magnet 30 is adopted: a magnet formed in the shape of the flat cylinder, whose peripheral shape as viewed from the tip side of the magnetic sensor is rectangular and having the rectangular through hole 31 formed in its central portion. The sensing chip 10 is housed in the through hole 31. In this manner, it is possible to form the sensor itself flat, and to install the sensor even in a place with limited space with a higher degree of freedom.

(2) The magnet 30 is so formed that its peripheral shape is rectangular. The outer dimensions of this magnet is so set that its width t1 in the direction perpendicular to the surface of the sensing chip 10 housed in the through hole 31 in its central portion is approximately ¼ of its width w1 in the direction along the surface of the sensing chip 10. In this manner, the peak safety margin and bottom safety margin for the differential amplification output can be sufficiently ensured relative to the threshold voltage Vth.

(3) With the power feed terminal T1 and the output terminal T2 connected with the lead frame 13, the sensing chip 10 is integrally placed over the tongue 21 of the case main body 20. Further, the magnet 30 is fit in such a manner that the magnet covers the tongue 21 of the case main body 20 together with the sensing chip 10. The open end 41 of the cap member 40 is joined with the case main body 20 in such a manner that the tongue lead-out face 22 of the case main body 20 is closed with the cap member 40. Thus, the tongue 21 and the magnet 30, together with the sensing chip 10, are protected from the external atmosphere. This facilitates the manufacture itself of the magnetic sensor and significantly improves the degree of freedom in designing. For example, the length of the sensing section relative to an object of detection can be reduced.

(4) The sensing chip 10, especially, the sensor chip 11 is mounted over the tongue 21 of the case main body 20 in a state of so-called bare chip. Adoption of the bare chip structure makes it possible to accurately position the sensor chip 11 when it is mounted on the tongue 21. In cases where the sensor chip 11 is molded with resin as in conventional magnetic sensors, stress strain due to internal stress during molding is not negligible. In the present embodiment, at least the sensor chip 11 is mounted as a bare chip on the tongue 21. As a result, the influence of stress strain on sensing characteristics is avoided.

(5) Thus, the sensing chip 10 is mounted as a bare chip over the tongue 21, but yet the sensing chip 10 and the magnet 30 are sealed together with the tongue 21 in the case main body 20 and the cap member 40. Therefore, they are favorably shut off from an external atmosphere.

(6) The magnetic sensor is so structured that a flange 23 for attaching the magnetic sensor is extended from the case main body 20 that holds the sensing chip 10 and the magnet 30 in the same direction as the direction in which the magnet 30 is flat. This makes it possible to make flat the shape of the magnetic sensor including its attaching portion, and this further enhances the degree of freedom with respect to the space for installation.

(7) The end face 32 of the magnet 30 is provided with the recessed portion 50, and the tongue lead-out face 22 of the case main body 20 is provided with the projected portion 60. The recessed portion 50 and the projected portion 60 are fit together. In this manner, the displacement of the magnet 30 from the tongue lead-out face 22 is arrested; therefore, the biasing of the magnet 30 toward the sensor chip 11 mounted over the tongue 21 is also arrested. Consequently, the relative positions of the magnet 30 and the magnetic resistance element pairs 1 and 2 in the sensor chip 11 relative to each other are set with accuracy.

Although the present invention has been fully described in connection with the preferred embodiment thereof with reference to the accompanying drawings, it is to be noted that various changes and modifications will become apparent to those skilled in the art.

For example, the magnetic sensor may be so constructed that the following is implemented: the end face 32 of the magnet 30 is provided with a projected portion instead of a recessed portion, and the tongue lead-out face 22 is provided with a recessed portion instead of a projected portion; and the projected portion and the recessed portion are fit together. In cases where the magnet 30 is precisely positioned relative to the sensor chip 11 mounted over the tongue 21, or in cases where the biasing of the magnet 30 toward the sensor chip 11 is negligible, the magnetic sensor may be constructed with such a fitting mechanism omitted.

The invention is not limited to the above embodiment that adopts the bare chip structure in which the sensing chip 10, especially the sensor chip 11 is mounted over the tongue 21 of the case main body 20 in a state of so-called bare chip. That is, the structure illustrated in FIG. 7A, which corresponds to FIG. 2, in accordance with the structure of conventional magnetic sensors can also be adopted. More practically, the sensing chip 10 is molded with resin with its power feed terminals T1 and T3 and output terminal T2 connected with a lead frame. This resin-molded sensing chip MDIC and a magnet 30a are housed in a cylindrical closed-end cap member that corresponds to the shape of the magnet 30a and is formed of non-magnetic material. Then, the cap member is integrally assembled to a case main body 20a formed of non-magnetic material. The sensing chip 10 may be constructed of the sensor chip in which magnetic resistance elements are placed and the processing circuit chip 12 that electrically processes magnetic detection signals from the magnetic resistance elements. In this case, the sensor chip 11 and the processing circuit chip 12 may be integrally molded with resin.

The above embodiment (including its modifications) is so constructed that the following is implemented: the sensor chip 11 and the processing circuit chip 12 are formed over separate semiconductor substrates; and the sensing chip 10 is constructed of these chips 11 and 12. However, structure of the sensing chip 10 is not limited to this form. As a structure of the sensing chip 10, so-called integrated one-chip structure, in which these chips 11 and 12 are formed over one and the same semiconductor substrate, may be adopted.

Figure 7A:
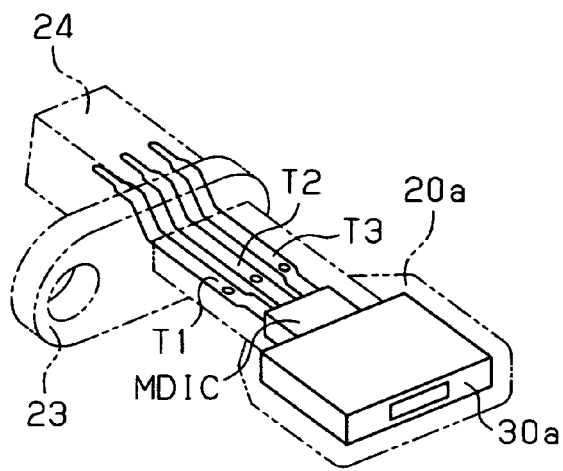
FIGS. 7A and 7B show illustrations of modification of the magnetic sensor.
Figure 7B:
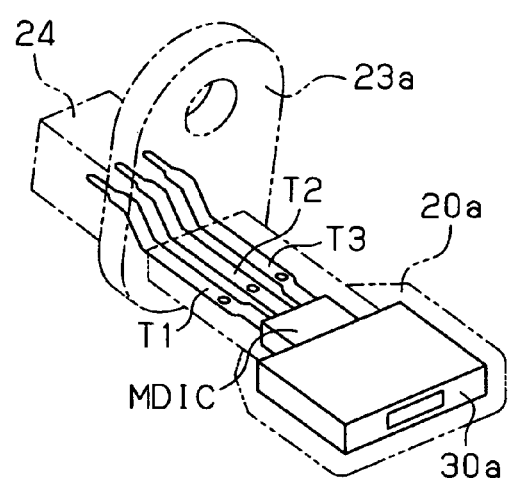

In the above embodiment (including its modifications), the flange 23 is constructed in a manner as illustrated in FIG. 2 and FIG. 7A. That is, the flange for attaching the magnetic sensor is extended from the case main body 20 or 20a that holds the sensing chip 10 and the magnet 30 or 30a in the same direction as the direction in which the magnet 30 or 30a is flat. The direction in which the flange is extended is arbitrary and may be changed depending on to what the magnetic sensor should be attached. For example, a flange 23a for attaching the magnetic sensor may be extended in the direction perpendicular to the direction in which the magnet 30 or 30a is flat, as illustrated in FIG. 7B.

In the above embodiment (including its modifications), the processing circuit chip 12 that electrically processes magnetic detection signals from the magnetic resistance element pairs 1 and 2 placed in the sensor chip 11 is constructed as follows: it is constructed based on the differential amplifier 12a that takes in the middle point potentials Va and Vb of the magnetic resistance element pairs 1 and 2 and the comparator 12b that binarizes the amplified signals of the differential amplifier 12a. In addition, the processing circuit chip 12 may be provided in it with a rewritable nonvolatile memory constructed of, for example, EPROM and a terminal for data for writing data for adjustment into this nonvolatile memory. For reference's sake, this data for adjustment includes:

a. Data for room temperature offset adjustment in the differential amplifier, incorporated in the processing circuit chip 12, b. Data for high temperature offset adjustment in the differential amplifier, incorporated in the processing circuit chip 12, etc.

When relevant values are corrected (compensated) using these data for adjustment, the detection accuracy of the entire sensing chip 10 is improved.

Figure 8A:
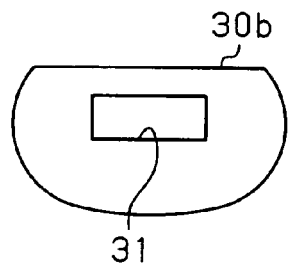
FIGS. 8A to 8C show illustrations of modifications of the magnet in the view from the rotor facing side.
Figure 8B:
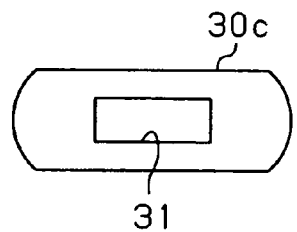
Figure 8C:
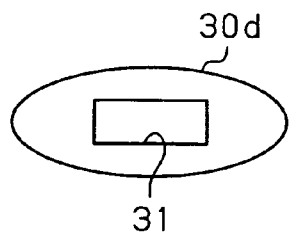

In the above embodiment (including its modifications), the magnet 30 is so formed that its peripheral shape as viewed from the end side of the magnetic sensor is rectangular. However, the peripheral shape of the magnet as viewed from the tip side of the magnetic sensor need not be rectangular. A magnet 30b may be so formed that its peripheral shape as viewed from the tip side of the magnetic sensor is in the shape of a combination of an oval and a polygon, as illustrated in FIG. 8A, which corresponds to FIG. 4. Or, a magnet 30c may be so formed that its peripheral shape as viewed from the tip side of the magnetic sensor is in the shape of a combination of an oval and a polygon, as illustrated in FIG. 8B, which corresponds to FIG. 4. Or, a magnet 30d may be so formed that its peripheral shape as viewed from the tip side of the magnetic sensor is oval, as illustrated in FIG. 8C, which corresponds to FIG. 4. In short, the same effects as with the above embodiment can be obtained by forming a magnet so that its peripheral shape as viewed from the tip side of the magnetic sensor is oval, polygonal, or in the shape of a combination of these shapes.

In the above embodiment (including its modifications), the circumferential shape of the magnet 30 or 30a is so set that the following is implemented: its width t1 in the direction perpendicular to the surface of the sensing chip 10 housed therein, as viewed from the end side of the magnetic sensor, is approximately ¼ of its width w1 in the direction along the surface of the sensing chip 10. However, the effect described in (2) above can be obtained by setting the circumferential shape of the magnet 30 or 30a so that its width t1 is approximately ¼ to ⅓ of its width w1. There is no limitation on the ratio of width t1 to width w1. In short, the effect described in (1) above can be obtained and the intended purpose can be accomplished by setting the dimensions of the magnet 30 so that the following is implemented: the height of the magnet 30 in the direction perpendicular to the surface of the sensing chip 10 as viewed from the tip side of the magnetic sensor is smaller than it's the width of the magnet in the direction along the surface of the sensing chip 10. That is, the intended purpose can be accomplished by forming the magnet in a flat cylindrical shape.

The above embodiment (including its modifications) is so constructed that the magnetic sensor is used as the rotation sensor to detect the rotation mode of an object of detection such as the rotor (rotation mode). However, the magnetic sensor of the present invention can be used to detect any motion mode, including linear motion and the like, of an object of detection composed of the magnetic material.

Such changes and modifications are to be understood as being within the scope of the present invention as defined by the appended claims.

What is claimed is:

1. A magnetic sensor comprising:
a sensing chip having a magnetoresistive element for sensing a magnetic vector;
a magnet for biasing the magnetic vector sensed by the magnetoresistive element;
a case body having a tongue portion that is made of a non-magnetic material, wherein the sensing chip is disposed integrally on the tongue portion of the case body in a condition that a power terminal and an output terminal of the sensing chip are coupled with a lead frame; and
a bottomed cylindrical cap member made of the non-magnetic material with the magnet fittingly inserted therein for protecting the tongue portion having the sensing chip disposed thereon from an external atmosphere, wherein an opening of the cap member covers a tongue supporting portion of the case body with an edge of the opening attached thereto,
wherein the sensing chip senses change in the magnetic vector for detecting a behavior of a magnetic body based on a variation of a resistance value of the magnetoresistive element when biasing of the magnetic vector is caused by the magnet in cooperation with the magnetic body that is in motion in a proximity of the sensing chip, and
the magnet takes a shape of a flat cylinder that houses the sensing chip in a hollow space bored therein.

2. The magnetic sensor as in claim 1,
wherein the sensing chip includes a sensor chip having the magnetoresistive element disposed therein and a processor circuit chip for electrically processing a magnet detection signal from the sensor chip, and
the sensor chip and the processor circuit chip are disposed on the tongue portion of the case body as a bare chip.

3. A magnetic sensor comprising:
a sensing chip having a magnetoresistive element for sensing a magnetic vector; and
a magnet for biasing the magnetic vector sensed by the magnetoresistive element,
wherein the sensing chip senses change in the magnetic vector for detecting a behavior of a magnetic body based on a variation of a resistance value of the magnetoresistive element when biasing of the magnetic vector is caused by the magnet in cooperation with the magnetic body that is in motion in a proximity of the sensing chip,
the magnet takes a shape of a flat cylinder that houses the sensing chip in a hollow space bored therein,
the sensing chip is molded by resin with a power terminal and an output terminal of the sensing chip coupled with a lead frame,
the sensing chip molded by resin and the magnet are housed in a cylindrical cap member that has one end closed, and
the cylindrical cap member made of a non-magnetic material is integrally attached to a case body made of the non-magnetic material.

4. The magnetic sensor as in claim 3,
wherein the sensing chip includes a sensor chip having the magnetoresistive element disposed therein and a processor circuit chip for electrically processing a magnet detection signal from the sensor chip, and
the sensing chip having the sensor chip and the processor circuit chip is integrally molded by resin.

5. A magnetic sensor comprising:
a sensing chip having a magnetoresistive element for sensing a magnetic vector; and
a magnet for biasing the magnetic vector sensed by the magnetoresistive element,
wherein the sensing chip senses change in the magnetic vector for detecting a behavior of a magnetic body based on a variation of a resistance value of the magnetoresistive element when biasing of the magnetic vector is caused by the magnet in cooperation with the magnetic body that is in motion in a proximity of the sensing chip,
the magnet takes a shape of a flat cylinder that houses the sensing chip in a hollow space bored therein, and
a case body for holding the sensing chip and the magnet has a flange that extends in a flattening direction of the magnet for installation of the magnetic sensor.

* * * * *